United States Patent [19]

Croisier et al.

[11] 4,076,986

[45] Feb. 28, 1978

[54] DEVICE FOR REPRODUCING THE CHARGE STORED IN AN INPUT CAPACITOR IN A PLURALITY OF OUTPUT CAPACITORS

[75] Inventors: Alain Croisier; René Glaise, both of Cagnes-sur-Mer, France

[73] Assignee: International Business Machines Corporation, Armonk, N.Y.

[21] Appl. No.: 730,057

[22] Filed: Oct. 6, 1976

[30] Foreign Application Priority Data

Oct. 31, 1975 France ............................... 75 33884

[51] Int. Cl.$^2$ ...................... H03K 17/02; H03K 17/56
[52] U.S. Cl. ............................... 307/221 D; 307/244; 328/105; 357/24
[58] Field of Search ............... 307/221 C, 221 D, 244, 307/304, 238; 328/105, 153, 37; 235/92 SH; 357/24

[56] References Cited

U.S. PATENT DOCUMENTS 3,819,954 6/1974 Butler et al. ...................... 307/221 D
3,983,408 9/1976 Adam et al. ...................... 307/221 D Primary Examiner—John Zazworsky Attorney, Agent, or Firm—John J. Goodwin

[57] ABSTRACT

Arrangement allowing an input bucket brigade (BBD) stage to feed several other BBD stages in parallel with no loss of the signal transferred from the input stage to the subsequent ones. An input voltage corresponding to a charge quantity is stored in the second capacitor of the input BBD stage. The drain of the output transistor of the input stage is connected to a first BBD stage wherein the first capacitor is connected to the source electrode of the first transistor of a second BBD stage. The first transistors of both stages are controlled by the same clock pulses. When these transistors are turned on, the capacitors connected thereto are in series with the second capacitor of the input stage. Consequently, the same current will flow through these capacitors, which will thus store the same charges so that the charge representing the input voltage will be reproduced in the first capacitors of the two BBD stages connected to the input stage. Means are provided for grounding the terminal of the first capacitor in the first stage that is connected to the source of the first transistor in the second stage at the time the transfer of the duplicated charge takes place.

6 Claims, 7 Drawing Figures

DEVICE FOR REPRODUCING THE CHARGE STORED IN AN INPUT CAPACITOR IN A PLURALITY OF OUTPUT CAPACITORS

BACKGROUND OF THE INVENTION

1. Field of the Invention

This invention relates to an arrangement for reproducing a charge representing an analog level without perturbing the original charge, and, more particularly, for reproducing the charge representative of an analog level in a charge transfer circuit of the type known to the art as a bucket brigade device (BBD).

2. Description of the Prior Art

U.S. Pat. No. 3,806,772 issued Apr. 23, 1974 to J. M. Early entitled CHARGE COUPLED AMPLIFIER and assigned to the Fairchild Camera and Instrument Corporation describes a charge amplification system incorporating a plurality of amplification stages embodied in charge-coupled device technology.

In the Early patent a first packet of charge is used to create a second packet of charge, however, the second packet of charge is not stated to be a duplicate or replica of the first charge packet. The Early patent also does not employ bucket brigade technology.

Attention is also directed to copending U.S. patent application, Ser. No. 625,425 filed Oct. 24, 1975 by L. G. Heller entitled A METHOD AND APPARATUS FOR REPLICATING A CHARGE PACKET and which is assigned to the present assignee. In this application a first charge packet is precisely duplicated by a charge coupled device circuit wherein the first charge packet tends to reduce a reference voltage by a corresponding value. This causes a corresponding diffusion current to flow and create a second charge packet which is identical to the first charge packet. This application is distinct in structure from the bucket-brigade device of the present invention.

SUMMARY OF THE INVENTION

Bucket brigade devices are well known and have been described in detail in a number of articles. Reference may be made to an article entitled CHARGE TRANSFER DEVICE PRINCIPLES OF OPERATION AND BASIC CHARACTERISTICS by James Meek in the Journal of Electronic Engineering, February 1975, page 38.

A stage of a bucket brigade device may be schematically represented in the form of discrete elements comprising two series-connected field effect transistors (FETs) and two capacitors each of which is connected between one of the controlled electrodes of a FET, usually the drain, and its control electrode, referred to as the gate. The gates of both transistors are controlled by clock signals that have the same frequency but are interleaved in time without overlap. An analog input voltage is transferred from the input to the output of the stage at the frequency of the clock signals.

Accordingly, such circuits can readily be used to realize delay lines or shift registers. Starting with a register comprised of one or more stages in cascade, different types of circuits such as dividers, adders, filters, etc., can be constructed.

In some applications, particularly in applications involving filters, it is desirable that a register should be capable of feeding several other registers in parallel with no loss of the signal transferred from the first register to the subsequent ones. Thus, the original signal applied to the first register can be used independently in different circuits.

An obvious solution to this problem is to apply the signal to be processed to the first stage of a bucket brigade device so that the signal will be represented at the output of said stage by the charge stored in the capacitor connected to the output transistor. This charge can be duplicated by applying the voltage level obtained at the output of the first stage, by means of a source-follower connection, to another stage identical with the first. A disadvantage of this solution is that the signal thus reproduced will not be an exact replica of the original signal, since the gain of the source-follower transistor cannot be absolutely equal to unity. Also, the capacitances in the two stages may not be identical, in which case the two charges representing the original voltage will be different. If such a solution were used to reproduce the input voltage several times, the errors would accumulate. Furthermore, additional BBD stages would be required to enable the reproduced charges to be simultaneously available.

Accordingly, it is an object of this invention to reproduce, in the capacitors of several parallel-connected stages of a bucket brigade device, the charge representative of an input voltage that is stored in the capacitor of an input stage of said device.

Another object of this invention is to reproduce the charge representing an input voltage applied to a bucket brigade circuit so that the reproduced charges will be available simultaneously.

In what follows, a bucket brigade circuit stage comprised of a first and a second FETs between the drains and the gates of which a first and a second capacitors are respectively connected will be referred to as a BBD stage.

In accordance with the present invention, an input register comprising at least one BBD stage receives an input voltage which is to be simultaneously available at various points.

This input voltage corresponds to the charge that is stored in the second capacitor of the output stage of the register when the transfers in the various stages have been completed.

The drain of the output transistor is connected to a first BBD stage in which the first capacitor is connected to the source which forms the input of a second BBD stage, instead of being connected to the gate. The first transistors in these two stages are controlled by the same clock pulses. Thus, when these transistors are conditioned conductive, the capacitors connected thereto will be in series with the second capacitor in the output stage of the input register. The same current will flow through these capacitors, which will thus store the same charges, so that the charge representing the input voltage will be reproduced in the first capacitors of the two BBD stages connected to the register. Means are provided for grounding the terminal of the first capacitor in the first stage that is connected to the source of the first transistor in the second stage at the time the transfer of the duplicated charges takes place.

The arrangement described above allows the charge to be duplicated. Starting with this basic setup, the charge can be duplicated $n$ times. To this end, $n$ additional stages instead of two should be connected in such a way that the first capacitors in all of these stages will be in series when the first transistors are turned on.

The foregoing and other objects, features and advantages of the invention will be apparent from the following more particular description of a preferred embodiment of the invention, as illustrated in the accompanying drawings.

DESCRIPTION OF THE PREFERRED EMBODIMENTS

Figures 1, 2, 3:
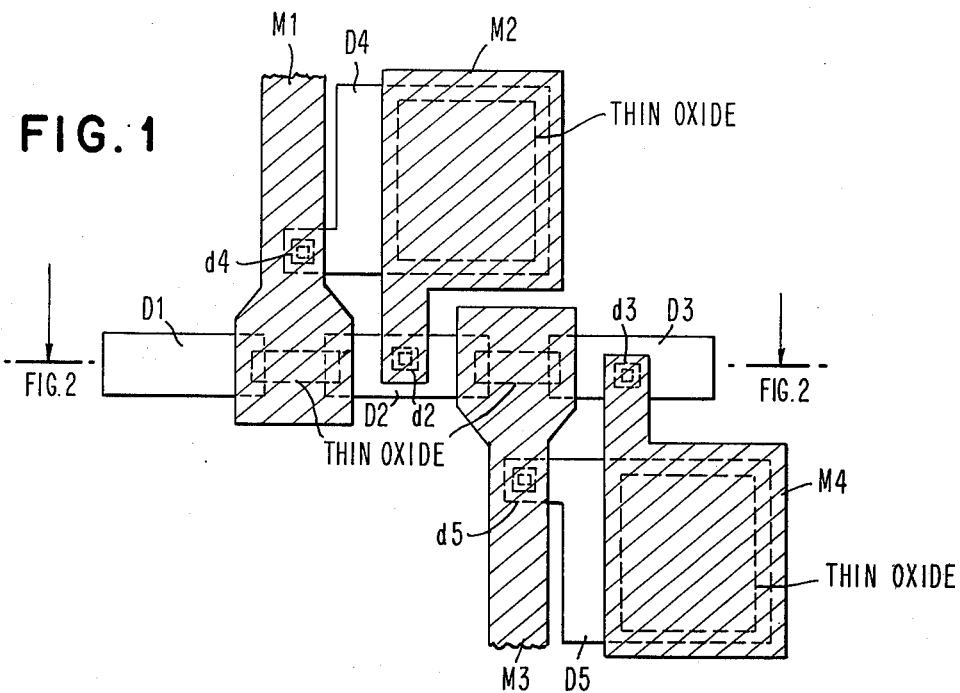
FIG. 1 is a top view of a stage of a bucket brigade circuit shown as an integrated circuit.
FIG. 2 is a cross-sectional view of the same circuit taken along line 2—2.
FIG. 3 represents an equivalent circuit in the shape of discrete elements.

Referring now to FIGS. 1 and 2, an exemplary implementation of a BBD stage is shown. This stage comprises a n-type or a p-type semiconductor substrate 1 wherein regions D1, D2 and D3 of a conductivity type opposite that of the substrate are diffused. The substrate is coated with a layer of silicium oxide. Metal electrodes M1 and M3 overlay the channel between two diffusion regions. The oxide layer under these electrodes is thinner. Two additional diffusion regions, D4, D5, and two more metal layers, M2, M4, are provided. The contacts with diffusion regions D2 to D5 through the oxide layer are shown as d2 to d5, respectively.

The equivalent circuit is shown in FIG. 3. Diffusion regions D1, D2, the oxide layer and the metal layer M1 make up a first FET 3 of the metal-oxide-semiconductor (MOS) type. Regions D1 and D2 form the controlled electrodes of the FET which, depending upon the bias applied thereto, will constitute the source and the drain. Layer M1 forms the control electrode, referred to as the gate, to which the clock pulses will be applied. Similarly, regions D2, D3, the oxide layer and the metal layer M3 make up a second MOS FET 5.

Diffusion region D4, the oxide layer and metal layer M2 constitute a capacitor 4 connected between control electrode M1 of FET 3 and the electrode formed by region D2. Similarly, diffusion region D5, the oxide layer and metal layer M4 form a capacitor 6 connected between control electrode M3 of FET 5 and the electrode formed by diffusion region D3.

Reference may be made to the Journal of Electronic Engineering article cited above for a detailed description of the operation of these devices.

Figure 4:
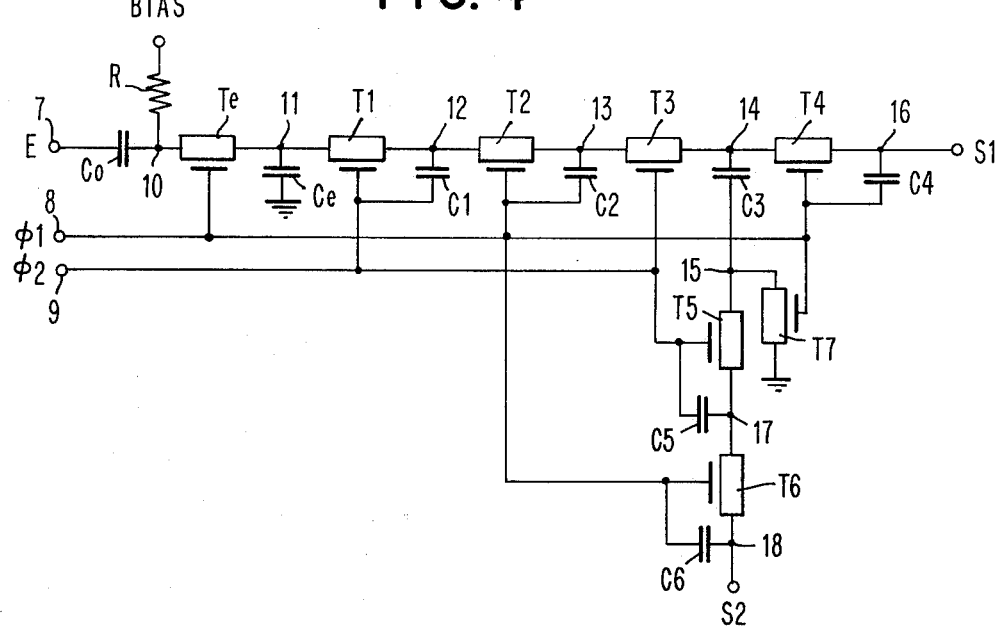
FIG. 4 is a schematic diagram of a charge duplicating device.
Figure 5:
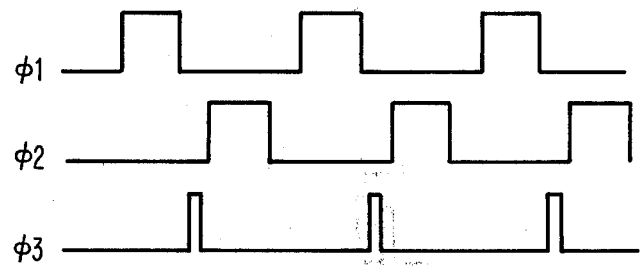
FIG. 5 shows the phase relationship between the pulses used to control the devices of FIGS. 4, 6 and 7.

Referring now to FIGS. 4 and 5, a charge duplicating arrangement realized in accordance with the present invention will be described.

The arrangement shown includes an input circuit consisting of an input terminal 7, a coupling capacitor Co, a FET Te and a capacitor Ce. Transistor Te is controlled by the train of pulses $\phi_1$ applied to terminal 8.

The input circuit is connected to an input BBD stage of the type shown in FIG. 1 and including two FETs T1, T2 and two capacitors C1, C2. T1 is controlled by clock pulses $\phi_2$ applied to terminal 9 and T2 is controlled by clock pulses $\phi_1$.

This input BBD stage is connected to a first BBD stage, comprising FETs T3, T4 and capacitors C3, C4. In this stage, capacitor C3 is not connected between the drain and the gate of T3 as in a normal stage; instead, the terminal of C3 which should have been connected to the gate is connected to a second BBD stage that includes FETs T5, T6 and capacitors C5, C6.

Transistors T3 and T5 are controlled by clock pulses $\phi_2$ and transistors T4, T6 by clock pulses $\phi_1$.

An FET T7 controlled by clock pulses $\phi_1$ is connected between the source of T5 and ground.

The capacitance of all capacitors Ce, C1 to C6, which are the MOS capacitors associated with the FETs, is equal to C. However, this equality is not essential to the implementation of the invention.

The operation of the charge duplicating device will now be described.

Initially, with clock pulses $\phi_1$ and $\phi_2$ being at a down level and the circuit being in its steady state, all capacitors C1 to C6, are charged to a reference voltage Vr. The voltage excursion from 0 to Vr will determine the dynamic range within which the input signals are to be maintained.

Capacitor Co eliminates the DC component of the input signal and, through the bias voltage applied to the source of transistor Te, the input signal level is maintained in the range from 0 to Vr volts.

The FETs are turned on when the voltage $V_{GS}$ (gate-source voltage) exceeds a threshold Vt. In order for this to hold true regardless of the input signal value (between 0 and Vr volts), the up level of control pulses $\phi_1$ and $\phi_2$, which cause the transistors to turn on, is equal to Vr+Vt.

When an input voltage Ve is applied to terminal E, with the generators of clock signal $\phi_1$ and $\phi_2$ being in operation, the level of voltage V1 at node 10 is in the range 0 to Vr as previously explained. When pulse $\phi_1$ goes to an up level, transistor Te is conditioned conductive and capacitor Ce is charged to voltage V1 and therefore stores a charge equal to Ce V1, which charge is applied to the input of BBD stage T1-T2.

When T1 is conditioned conductive, with pulse $\phi_2$ being at an up level, capacitor C1, previously charged to C1 Vr, discharges through T1 into Ce until the voltage level at node 11 becomes equal to Vr, thereby turning T1 off. Accordingly, the new charge stored in C1 is $$q_1 = C\, Vr - \Delta q_1$$

where $$\Delta q_1 = C\, Vr - C\, V_1$$

hence $$q_1 = C\, V_1$$

which is equal to the charge previously stored in Ce.

Similarly, when T2 is in its conductive state, the charge differential $\Delta q_1$ is transferred from capacitor C1 to capacitor C2 in which it is then available for duplication.

During the next half-period of the clock signal, when transistors T3 and T5 are turned on by clock pulse $\phi_2$, capacitors C2, C3, C5 become series-connected through transistors T3 and T5 which operate in their non-linear saturation region and the same current flows through them. Consequently, during the time during which T3 remains in its conductive state, that is, until the voltage level at the node 13 reaches, $V_r$, the charge differentials $\Delta q_3$ and $\Delta q_5$ for capacitors C3 and C5, respectively, will both be equal to $\Delta q_1$.

After T3 and T5 have been turned off through pulses $\phi 2$ dropping to a down level, pulses $\phi 1$ cause transistors T4, T6 and T7 to turn on.

Thus, node 15 is grounded and the charge differentials associated with C3 and C5 are transferred to C4 and C6.

Consequently, the duplicated charge differentials $\Delta q_4$ and $\Delta q_6$ are simultaneously available in capacitors C4 and C6 and can be used in the subsequent stages connected to the two outputs S1 and S2.

The circuit illustrated in FIG. 4 has a disadvantage which is discussed below with reference to FIG. 6.

Figure 6:
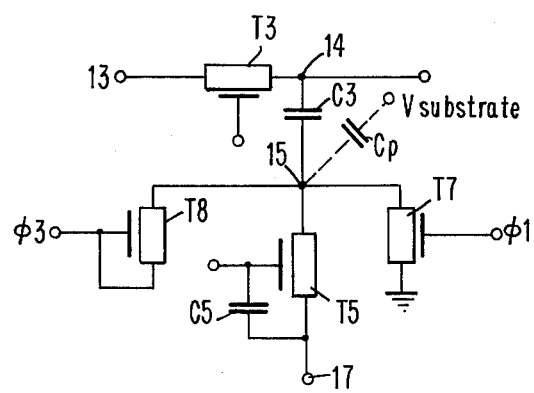
FIG. 6 represents a portion of the diagram of FIG. 4 to which a compensation circuit has been added.

FIG. 6 shows that part of the circuit of FIG. 4 which is included between nodes 13 and 17 and is provided with an additional device, namely transistor T8, to enhance the operation of the charge duplicating arrangement.

Capacitor C3 is formed in the same manner as the other capacitors except that the location of diffusion region D5 has been changed to provide a contact with the diffusion region of the next transistor, T5. There exists at node 15 a parasitic capacitor $C_p$ shown in phantom and formed by the diffusion that makes up the lower electrode of capacitor C3, which is reverse-biased relative to the substrate. This parasitic capacitor, the value of which is about one fourth that of C3, is inconvenient in that capacitor C5 can discharge into the parasitic capacitor, so that there will be a continuous shifting which, although it will not preclude satisfactory operation as long as the signal level remains in the range from 0 to $V_r$, will nonetheless limit the dynamic range.

To overcome this difficulty, transistor T8, the drain and the source of which are interconnected, has been added to the circuit of FIG. 4. Pulses $\phi 3$, whose up level is equal to $V_r + V_t$ when pulses $\phi 1$ and $\phi 2$ are at a down level, are applied to the gate of T8 after pulse $\phi 1$ returns to the down level and before pulse $\phi 2$ rises to the up level, as shown in FIG. 5.

Thus, before transistors T3 and T5 are turned on to perform the charge duplication operation, transistor T8, which was turned on while pulse $\phi 3$ was at an up level, will enable capacitor $C_p$ to precharge to $V_r$ so as to compensate for its detrimental effect at the time the charge is duplicated.

Some numerical values for the various voltages will now be given where the transistors in the BBD stages are N-channel MOS transistors.

The threshold voltage $V_t$ is of the order of 2 volts, the reference voltage $V_r$ is of the order of 8 volts, and the substrate voltage is $-5$ volts. The value of capacitors $C_e$, C1 to C6, is of the order of 1 pf.

Figure 7:
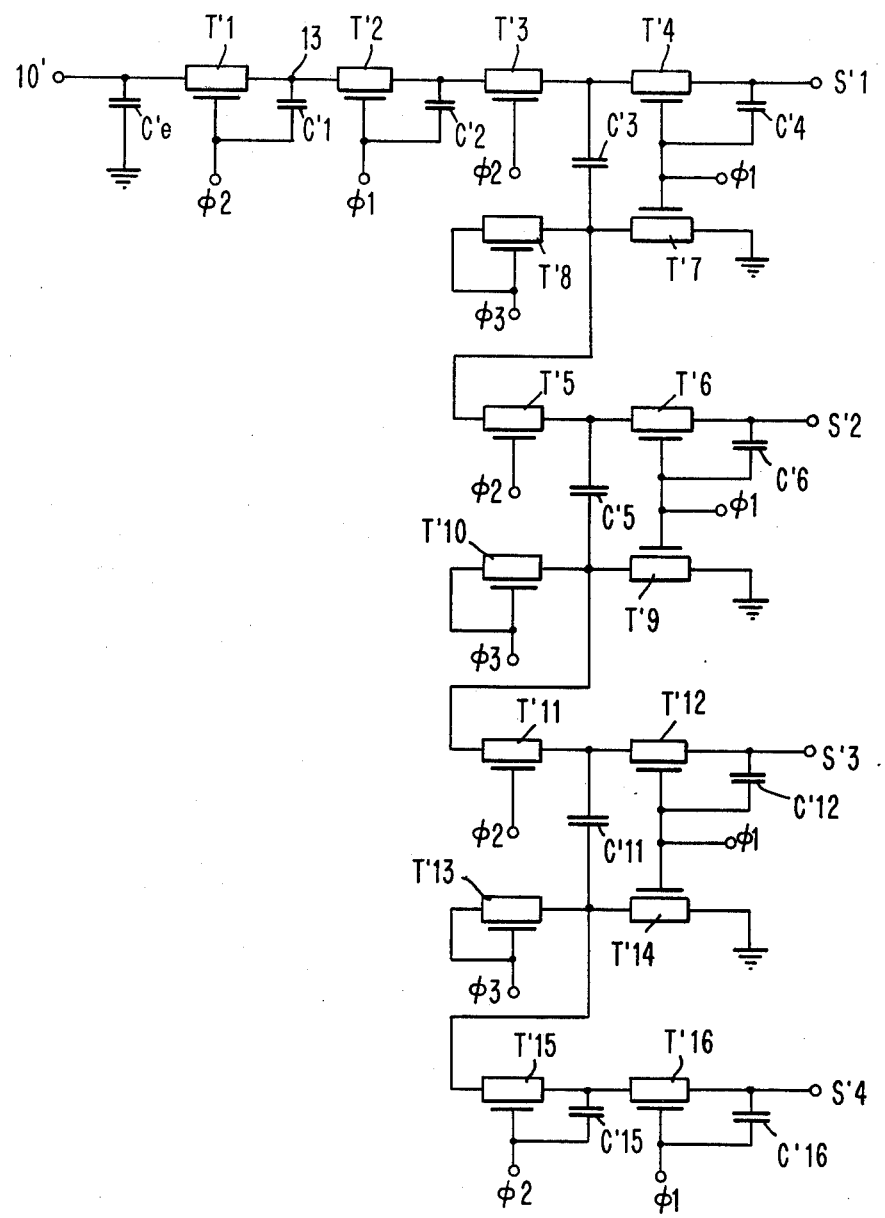
FIG. 7 shows a device capable of reproducing the original charge four times.

The circuit described above enables the charge to be duplicated. Referring to FIG. 7, there will now be shown how the principles of the present invention can be extended to reproduce the charge stored in capacitor C2 in a plurality of BBD stages connected in parallel.

FIG. 7 illustrates four stages which provide at four outputs S'1 to S'4 replicas of the input voltage applied to terminal 10'.

Primes (') have been added to the reference numerals of those elements of FIG. 7 which are like elements of FIGS. 4 and 6.

The control pulses $\phi 1$, $\phi 2$, $\phi 3$ used in the circuit of FIG. 4 have the same phase relationships and the same amplitudes as those shown in FIG. 5.

The circuit of FIG. 7 includes an input stage T'1 and T'2 identical with the input stage of the circuit of FIG. 2a, and four stages connected in parallel T'3-T'4, T'5-T'6, T'11-T'12 and T'15-T'16 associated with capacitors C'3-C'4, C'5-C'6, C'11-C'12 and C'15-C'16, respectively.

Transistors T'3, T'5, T'11 and T'15 are controlled by clock pulses $\phi 2$ that are applied to their gates. Transistors T'4, T'6, T'12 and T'16 are controlled by clock pulses $\phi 1$ applied to their gates.

The first stage T'3-T'4 is absolutely identical with stage T3-T4 of the circuit of FIG. 2a. In the second stage, T'5-T'6, capacitor C'5 is connected to the source of T'11 rather than to the gate of T'5. Similarly, in the third stage, T'11-T'12, capacitor C'11 is connected to the source of T'15 rather than to the gate of T'11. The fourth stage, T'15-T'16, is connected normally, that is, capacitor C'15 is connected to the gate of T'15.

Transistors T'7, T'9, T'14 in the first three stages have the same function as transistor T7 in the circuit of FIG. 2a. Transistors T'8, T'10 and T'13 have the same function as transistor T8 in FIG. 6. Therefore, their operation will not further be described.

In view of the location of capacitors C'3, C'5, C'11 and C'15, when transistors T'3, T'5, T'11 and T'15 are turned on under control of pulses $\phi 2$, with the charge to be reproduced being stored in C'2, capacitors C'2, C'3, C'5, C'11 and C'15 become series-connected and the same current flows through these capacitors. Consequently, at the time the voltage at node 13' becomes equal to $V_r$, thereby turning T'3 off, the charge differentials in C'3, C'5, C'11 and C'15 are equal to the charge differential in C'2.

The transfers in output capacitors C'4, C'6, C'12 and C'16 are possible when transistors T'4, T'6, T'12 and T'11 are turned on.

The corresponding information can therefore be used in different circuits connected to outputs S'1, S'2, S'3 and S'4.

Although four circuits in which the charges are reproduced have been shown by way of example in FIG. 7, it should be understood that no limitation is intended thereby. However, because of the effects of the parasitic capacitors, the number of circuits cannot be increased indefinitely as this would cause the dynamic range of the output signals to become narrower than that of the input signals.

While the invention has been particularly shown and described with reference to a preferred embodiment thereof, it will be understood by those skilled in the art that numerous changes in form and details may be made therein without departing from the spirit and scope of the invention.

What is claimed is:

1. An N stage bucket brigade device (BBD) for reproducing in each of N output capacitors the same charge quantity stored in an input capacitor, wherein N is an integer, comprising
an input capacitor, N bucket brigade device stages, each stage including
a first field effect transistor having first and second controlled current carrying electrodes and a control electrode to which a first clock signal is applied, and a first capacitor having a first and a second terminals, said first terminal being connected to said second controlled electrode of said first transistor, a second field effect transistor having first and second controlled current carrying electrodes and a control electrode to which a second clock signal is applied, and a second capacitor having a first and a second terminals, said capacitor being connected between said second controlled electrode of said first transistor and the control electrode, said second controlled electrode of said first transistor being connected to said first controlled electrode of said second transistor, means for connecting said input capacitor to said first controlled electrode of said first transistor in said first one of said N BBD stages, means for causing said input capacitor and said first capacitors in each of said N stages to be connected in series when said first transistors in said N stages are in their conductive state, and means for causing said second terminal of said first capacitors in each of said N stages to be connected to ground while said first transistors in said N stages are turned off and said second transistors in said N stages are turned on.

2. A device according to claim 1, wherein said means for connecting said input capacitor to said first BBD stage include at least one additional BBD stage comprising:

a first field effect transistor having a control electrode that receives the first clock signal and first and second controlled current carrying electrodes, said first controlled electrode being connected to said input capacitor, a first capacitor being connected between said second controlled electrode and said control electrode, and a second field effect transistor having a control electrode that receives said second clock signal and first and second controlled current carrying electrodes, said first controlled electrode being connected to said second controlled electrode of said first transistor, a second capacitor being connected between said second controlled electrode and said control electrode.

3. A device according to claim 1, wherein said means for causing said input capacitor and said first capacitors in each of said N stages to be connected in series include connections between said second terminal of said first capacitors in each of the first N−1 stages and the first controlled electrode of the first transistor in the next stage, and a connection between the second terminal of the first capacitor in the last stage and the control electrode of the first transistor in that stage.

4. Device according to claim 1, wherein said means for causing said second terminal of said first capacitor in each of said N stages to be connected to ground includes, in each stage, a field effect transistor to the control electrode of which the second clock signal is applied, one of the controlled electrodes being connected to the second terminal of the first capacitor and the other controlled electrode being connected to ground.

5. A device according to claim 3, wherein said means for grounding the second terminal of the first capacitor in each of the first N−1 stages include, in each of the N−1 first stages, a field effect transistor to the control electrode of which the second clock signal is applied, one of the controlled electrodes being connected to the second terminal of the first capacitor and the other controlled electrode being connected to ground.

6. Device according to claim 3, wherein each of said first N−1 BBD stages includes a field effect transistor the control electrode of which receives a third clock signal and is connected to one of the controlled electrodes, the other controlled electrode being connected to the second terminal of the first capacitor.

* * * * *